(12) United States Patent
Hung

(10) Patent No.: US 9,935,046 B1
(45) Date of Patent: Apr. 3, 2018

(54) PACKAGE DEVICE AND MANUFACTURING METHOD THEREOF

(71) Applicant: Unimicron Technology Corp., Taoyuan (TW)

(72) Inventor: Ying-Po Hung, Hsinchu County (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 15/460,249

(22) Filed: Mar. 16, 2017

(30) Foreign Application Priority Data

Jan. 16, 2017 (TW) .............................. 106101446 A

(51) Int. Cl.
*H01L 23/498* (2006.01)
*H01L 21/48* (2006.01)
(Continued)

(52) U.S. Cl.
CPC ...... *H01L 23/49838* (2013.01); *H01L 21/486* (2013.01); *H01L 21/4857* (2013.01); *H01L 21/565* (2013.01); *H01L 21/568* (2013.01); *H01L 21/6835* (2013.01); *H01L 23/3114* (2013.01); *H01L 23/3121* (2013.01); *H01L 23/49822* (2013.01); *H01L 23/49827* (2013.01); *H01L 23/49866* (2013.01);
(Continued)

(58) Field of Classification Search
CPC .......... H01L 2924/3511; H01L 21/565; H01L 25/0657; H01L 23/49838; H01L 23/49827; H01L 23/49866; H01L 23/3114; H01L 23/49822; H01L 23/3121; H01L 24/17; H01L 23/562; H01L 21/568; H01L 24/81; H01L 21/6835; H01L 21/4857; H01L 21/486; H01L 2225/06548; H01G 7/028; H05K 1/0271
See application file for complete search history.

(56) References Cited

U.S. PATENT DOCUMENTS

2012/0038043 A1* 2/2012 Jin ................... H01L 23/49811
257/737
2013/0193531 A1 8/2013 Nishikawa et al.
2016/0276292 A1* 9/2016 Shin ...................... H01L 23/562

FOREIGN PATENT DOCUMENTS

CN 101626018 A 1/2010
TW 201112377 A1 4/2011
(Continued)

*Primary Examiner* — Joseph C Nicely
*Assistant Examiner* — Pavel Ivanov
(74) *Attorney, Agent, or Firm* — CKC & Partners Co., Ltd.

(57) ABSTRACT

A package device and a method for fabricating thereof are provided. The package device includes a substrate, a redistribution structure, a circuit board structure, a plurality of first connectors and a first electronic component. The redistribution structure is disposed over the substrate. The redistribution structure includes a first dielectric layer and a first metal layer. The circuit board structure disposed over the redistribution structure. The circuit board structure includes a second dielectric layer and a second metal layer. The second dielectric layer of the circuit board structure has a plurality of protrusions embedded in the first dielectric layer of the redistribution structure. A first electronic component is disposed on the redistribution structure, and the first connectors are interposed between the redistribution structure and the first electronic component to interconnect the two.

12 Claims, 18 Drawing Sheets

(51) Int. Cl.
*H01L 21/683* (2006.01)
*H01L 23/00* (2006.01)
*H01L 21/56* (2006.01)
*H01L 23/31* (2006.01)
*H01L 25/065* (2006.01)

(52) U.S. Cl.
CPC ............ *H01L 23/562* (2013.01); *H01L 24/17* (2013.01); *H01L 24/81* (2013.01); *H01L 25/0657* (2013.01); *H01L 2221/68345* (2013.01); *H01L 2221/68359* (2013.01); *H01L 2224/13111* (2013.01); *H01L 2224/16227* (2013.01); *H01L 2225/06517* (2013.01); *H01L 2225/06548* (2013.01); *H01L 2924/3511* (2013.01)

(56) References Cited

FOREIGN PATENT DOCUMENTS

| | | |
|---|---|---|
| TW | 201216428 A1 | 4/2012 |
| TW | 201308453 A1 | 2/2013 |
| TW | 201423947 A | 6/2014 |
| TW | 201505085 A | 2/2015 |

\* cited by examiner

PACKAGE DEVICE AND MANUFACTURING METHOD THEREOF

RELATED APPLICATION

This application claims priority to Taiwan Application Serial Number 106101446, filed Jan. 16, 2017, which is herein incorporated by reference.

BACKGROUND

Field of Invention

This disclosure relates to a package device and a method for manufacturing the same.

Description of Related Art

With the rapid growth of electronic industry, research and development (R&D) of electronic product gradually enters the pursuit of versatile and high performance. In order to achieve the requirements of high integration and miniaturization of semiconductor components, the requirements of circuit redistribution structures also increase. For example, a line width and a pitch of a circuit redistribution structure are required to be smaller and smaller, and the overall thickness of the circuit redistribution structure is required to be smaller and smaller. With the miniaturization of the requirements, it is bound to need to improve the contact yield and overall reliability.

In preparing the package device, the later formed circuit board structure is stacked on a previously formed redistribution structure where the previously formed redistribution structure is susceptible to extrusion resulting in deformation or warp. This phenomenon leads to decrease in the contact yield between the circuit board structure and the redistribution structure and also leads to decrease in the overall reliability. In order to improve the above problems, persons in the industry all endeavor to search for the solutions. How to provide a package device with better and highly reliable characteristics is one of the important research topics, and is also a target that needs to be improved in the related fields.

SUMMARY

The invention provides a method for manufacturing a package device to enhance the contact yield and overall reliability of the package device.

In one aspect of the disclosure, a method for manufacturing a package device is provided. The method includes several steps. First, forming at least one redistribution structure on a substrate. The formation of the redistribution structure comprising: forming a first dielectric layer on the substrate; removing a portion of the first dielectric layer to form a plurality of first openings; and filling a first metal layer in the first openings. The method for manufacturing a package device also includes forming a plurality of trenches in a first side of the redistribution structure; forming a circuit board structure on the first side of the redistribution structure, and the redistribution structure is electrically connected to the circuit board structure. The formation of the circuit board structure comprising: forming a second dielectric layer on the first side of the redistribution structure and filling the second dielectric layer in the trenches; removing a portion of the second dielectric layer to form a plurality of second openings; filling a second metal layer in the second openings. The method for manufacturing a package device also includes removing the substrate.

In one or more embodiments, the method further includes the steps: disposing a first electronic component on a second side, opposite to the first side, of the redistribution structure. The first electronic component electrically connected to the redistribution structure.

In one or more embodiments, the trenches are formed penetrating the redistribution structure.

In one aspect of the disclosure, a method for manufacturing a package device is provided. The method includes several steps. First, forming at least one redistribution structure on a substrate. The formation of the redistribution structure comprising: forming a first dielectric layer on the substrate; removing a portion of the first dielectric layer to form a plurality of first openings; and filling a first metal layer in the first openings. The method for manufacturing a package device includes removing a portion of the first dielectric layer to form a plurality of trenches in a first side of the redistribution structure; disposing a first electronic component on the first side of the redistribution structure, wherein the first electronic component is electrically connected to the redistribution structure; forming a molding layer covering the redistribution structure and the first electronic component, and filling the molding layer in the trenches; and removing the substrate.

In one or more embodiments, the trenches are formed penetrating the redistribution structure.

In one or more embodiments, the method further includes the steps: forming a plurality of conductive posts on the first side of the redistribution structure before forming the molding layer, and electrically connecting the conductive posts to the redistribution structure; thinning the molding layer to expose the conductive posts; forming a plurality of second connectors on the molding layer, and electrically connecting the second connectors to the conductive posts; and deposing a second electronic component on the second connectors to form a package on package structure.

In another aspect of the disclosure, a package device is provided. The package device includes at least one redistribution structure, a circuit board structure, a first electronic component and a plurality of first connectors. The redistribution structure comprising: a first dielectric layer and a plurality of first metal lines disposed in the first dielectric layer. The circuit board structure disposed on a first side of the redistribution structure. The circuit board structure comprising: a second dielectric layer and a plurality of second metal lines. The second dielectric layer has a plurality of protrusions embedded in the redistribution structure. The plurality of second metal lines located in the second dielectric layer and electrically connected to the redistribution structure. The first electronic component disposed on a second side, opposite to the first side, of the redistribution structure. The plurality of first connectors disposed between the redistribution structure and the first electronic component, and the first connectors electrically connect the redistribution structure and the first electronic component.

In one or more embodiments, the protrusions of the second dielectric layer are formed penetrating the redistribution structure.

In one or more embodiments, a Young's modulus of the second dielectric layer is larger than a Young's modulus of the first dielectric layer.

In one or more embodiments, a thermal expansion coefficient of the second dielectric layer is smaller than a thermal expansion coefficient of the first dielectric layer.

In another aspect of the disclosure, a package device is provided. The package device includes at least one redistribution structure, a first electronic component, a plurality of first connectors and a molding layer. The redistribution structure comprising: a first dielectric layer and a plurality of first metal lines located in the first dielectric layer. The first electronic component is disposed on the redistribution structure. A plurality of first connectors is disposed between the redistribution structure and the first electronic component, and the first connectors electrically connect the redistribution structure and the first electronic component. A molding layer covering the redistribution structure and the first electronic component, and the molding layer having a plurality of protrusions embedded in the redistribution structure.

In one or more embodiments, a Young's modulus of the molding layer is larger than a Young's modulus of the first dielectric layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One of the technical aspects of this disclosure is to provide a package device and a method of manufacturing the same, which improves the contact yield, structural stability and structural flatness of the package body.

FIGS. 1 to 6C illustrate schematic cross-sectional views of different steps of the manufacturing method of the package device 100 according to one embodiment of this disclosure.

In the embodiment shown in FIG. 1A, the substrate 110 is provided and the release film 112 is formed on the substrate 110. The substrate 110 may be a glass substrate, a metal substrate or an organic material substrate. The material of the release film 112 may be polyethylene terephthalate (PET). It is to be understood that the material of the substrate 110 and the release film 112 described above are merely illustrative and are not intended to limit this disclosure. The person having ordinary skill in the art can make proper modifications to the substrate 110 and the release film 112 depending on actual applications.

Figure 1:
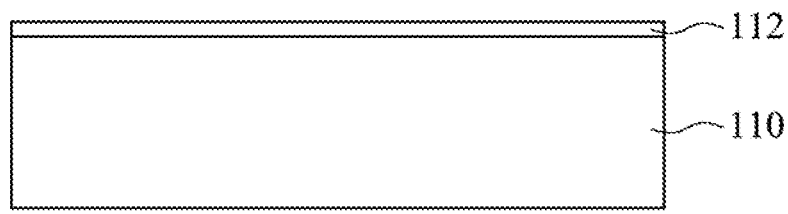
FIG. 1 to FIG. 6C are schematic cross-sectional views illustrating different steps of the manufacturing method of the package device according to one embodiment of this disclosure.
Figure 2:
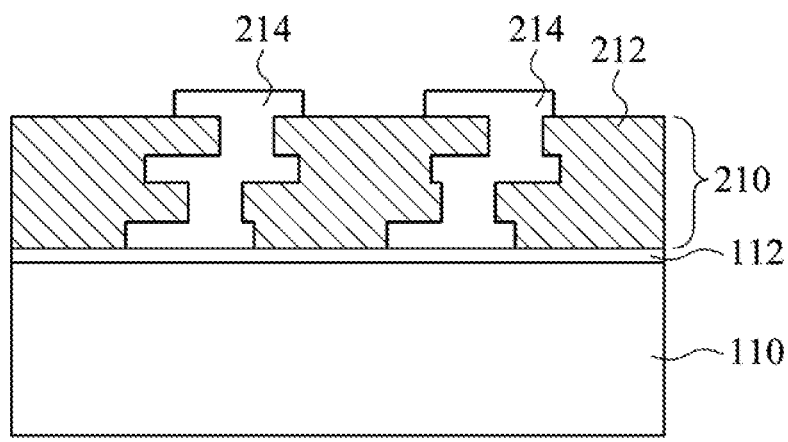

In the embodiment shown in FIG. 2, a redistribution structure 210 is formed on the substrate 110. The redistribution structure includes a first dielectric layer 212 and first metal lines 214 formed by a first metal layer. The method of forming the redistribution structure 210 includes forming the first dielectric layer 212 on the substrate 110, and then removing a portion of the first dielectric layer 212 to form a plurality of first openings. Next, the first metal layer is filled in the plurality of first openings to form a plurality of first metal lines 214. The person having ordinary skill in the art can make proper modifications as necessary to repeat the formation of the redistribution structure 210 to form a plurality of redistribution structures 210.

In some embodiments of this disclosure, the material of the first metal lines 214 comprises aluminum (Al), copper (Cu), tungsten (W), or a combination thereof, but is not limited thereto, and other suitable conductive materials may likewise be used to form the first metal lines 214. In some embodiments of this disclosure, the first dielectric layer 212 is comprised of a material capable of forming high density fine lines. In some embodiments, the material of the first dielectric layer 212 is a photoimageable dielectric material, such as polybenzoxazole (PBO). It is to be understood that the material of the first dielectric layer 212 described above is by way of example only and is not intended to limit the invention, and that the person having ordinary skill in the art can make proper modifications to the first dielectric layer 212 depending on actual applications.

Figure 3A:
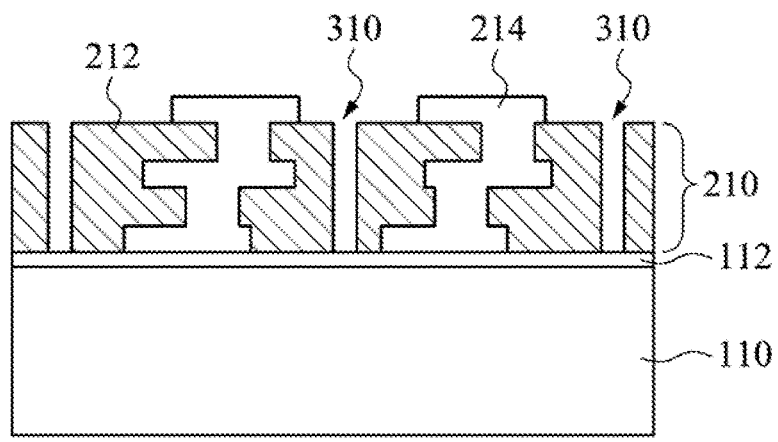
Figure 3B:
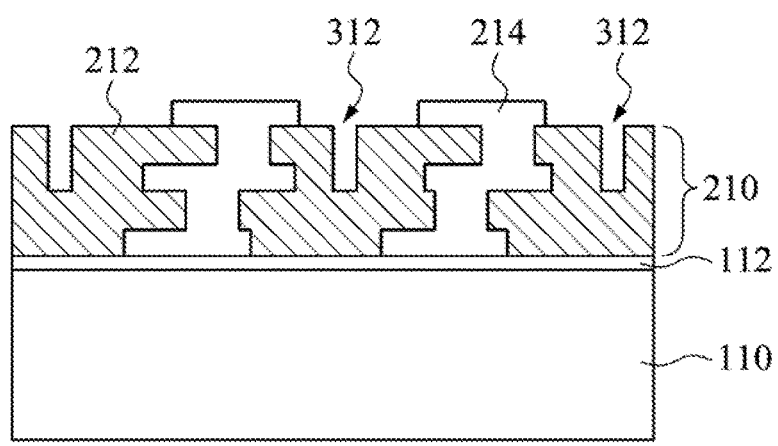

In the embodiment depicted in FIG. 3A and FIG. 3B, a plurality of trenches 310, 312 are formed in the first side of the redistribution structure 210, respectively. In particular, the partial first dielectric layer 212 is removed to form a plurality of trenches 310 in the area where there is no metal lines in the redistribution structure. It is to be noted that the plurality of trenches 310 may penetrate the first dielectric layer 212 to expose the release film 112 (as depicted in FIG. 3A). The plurality of trenches 312 may not penetrate the first dielectric layer 212 (as illustrated in FIG. 3B). In some embodiments, the sidewalls of the trenches 310, 312 may be curved or flat. In some embodiments, the widths of the trenches 310, 312 may be from 30 µm to 300 µm, such as 50 µm, 100 µm, 200 µm or 250 µm. In some embodiments, the depth of the trenches may be adjusted as desired. The trenches are formed by a dry etching process, a wet etching process, an exposure developing process or a laser process.

Figure 4A:
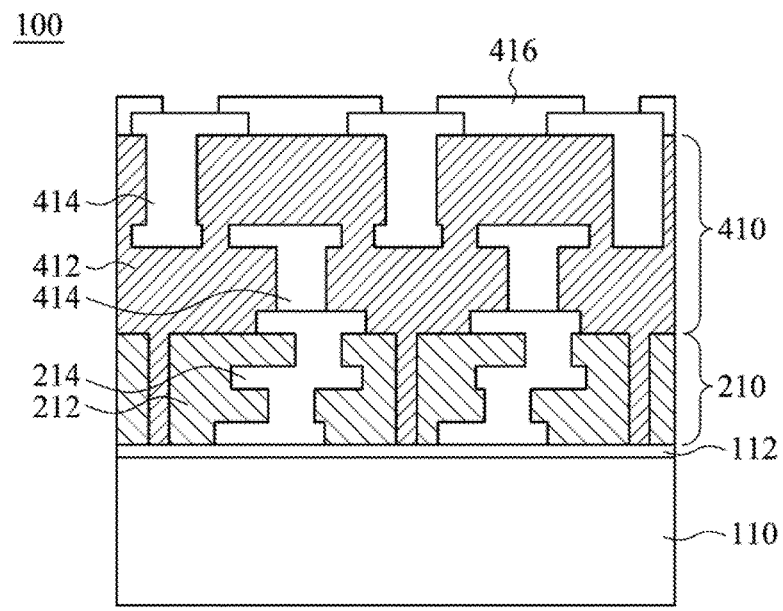

In the embodiment depicted in FIG. 4A, the circuit board structure 410 is formed on the first side of the redistribution structure 210 in FIG. 3A. The formation of the circuit board structure 410 includes the following steps. First, the second dielectric layer 412 is formed on the first side of the redistribution structure 210 and the second dielectric layer 412 is filled into the trenches 310, which are formed penetrating the first dielectric layer 212. As a result, the second dielectric layer 412 has a plurality of protrusions embedded in the redistribution structure 210. A portion of the second dielectric layer 412 is removed to form a plurality of second openings. Next, the second metal layer is filled within a plurality of second openings to form a plurality of second metal lines 414. Then, a solder mask structure 416 is formed on the circuit board structure 410. The person having ordinary skill in the art can make proper modifications as necessary to repeat the formation of the circuit board structure 410 to form a plurality of circuit board structures 410.

Figure 4B:
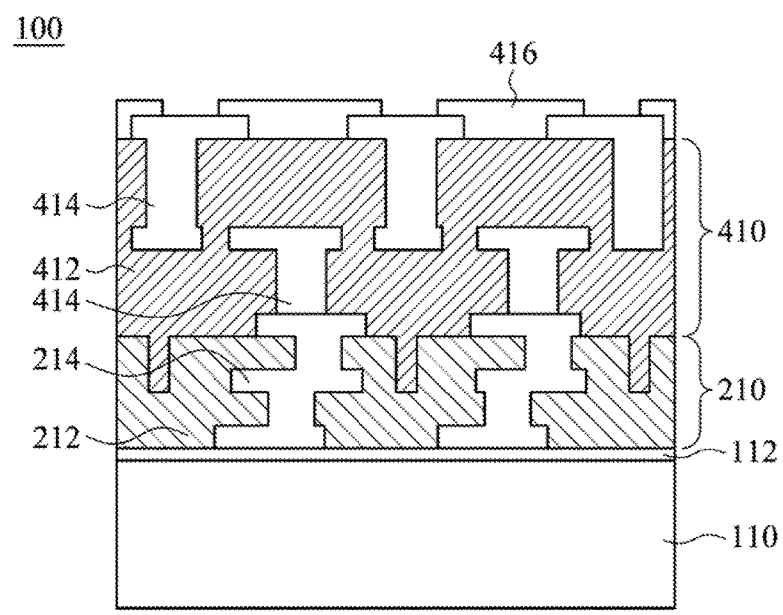

In the embodiment depicted in FIG. 4B, the circuit board structure 410 is formed on the first side of the redistribution structure 210 in FIG. 3B. The formation of the circuit board structure 410 includes the following steps. First, the second dielectric layer 412 is formed on the first side of the redistribution structure 210 and the second dielectric layer 412 is filled within the trenches 312 that are formed not penetrating the first dielectric layer 212. As a result, the second dielectric layer 412 has a plurality of protrusions embedded in the redistribution structure 210. A portion of the second dielectric layer 412 is removed to form a plurality of second openings. Then, the second metal layer is filled within a plurality of second openings to form a plurality of second metal lines 414. Then, a solder mask structure 416 is formed on the circuit board structure 410. The person having ordinary skill in the art can make proper modifications as necessary to repeat the formation of the circuit board structure 410 to form a plurality of circuit board structures 410.

In some embodiments of this disclosure, the material of the second metal lines 414 contains aluminum, copper, tungsten, or a combination thereof, but is not limited thereto, and other suitable conductive materials may likewise be used to form second metal lines 414. In some embodiments of this disclosure, the material of the second dielectric layer may be resin, epoxy, polyimide, Bismaleimide triazine (BT), fiber impregnated with resin (Prepreg, PP), ABF resin (Ajinomoto Build up Film, one type of epoxy insulating film provided by Anjinomoto Co., Ltd.) or other suitable materials. In some embodiments of this disclosure, the thermal expansion coefficient of the second dielectric layer 412 is less than the thermal expansion coefficient of the first dielectric layer 212. In some embodiments of this disclosure, the Young's modulus of the second dielectric layer 412 is higher than the Young's modulus of the first dielectric layer 212.

In the manufacturing process of some embodiments of this disclosure, a plurality of trenches 310, 312 are formed in the first dielectric layer 212 of the redistribution structure 210. The plurality of trenches 310, 312 are filled with the second dielectric layer 412 of the circuit board structure 410, which will be stacked on the redistribution structure 210. This process and the resulting structure can enhance the stability of the overall structure and avoid the redistribution structure 210 deformed or warped during the formation of the circuit board structure 410. Therefore, embodiments of this disclosure can improve contact yield, overall reliability and flatness.

Figure 5A:
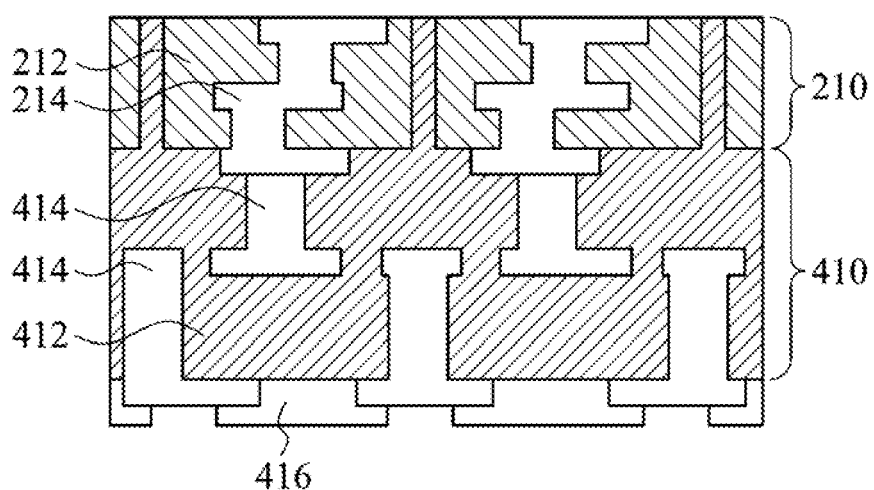
Figure 5B:
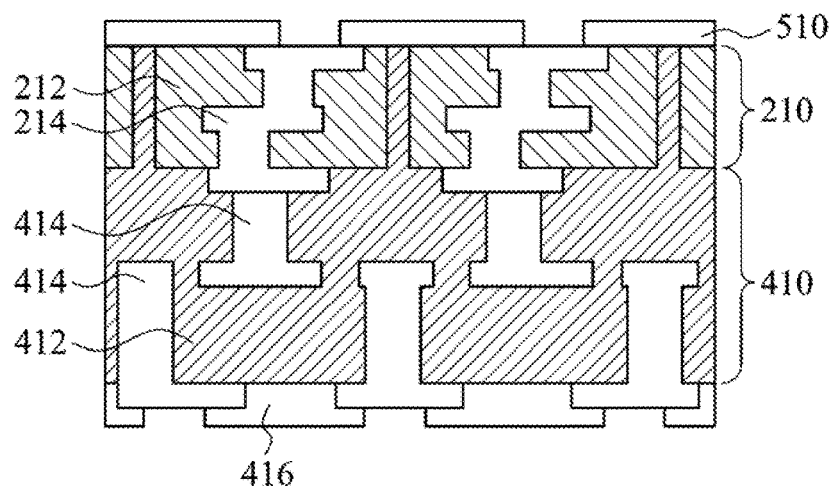
Figure 5C:
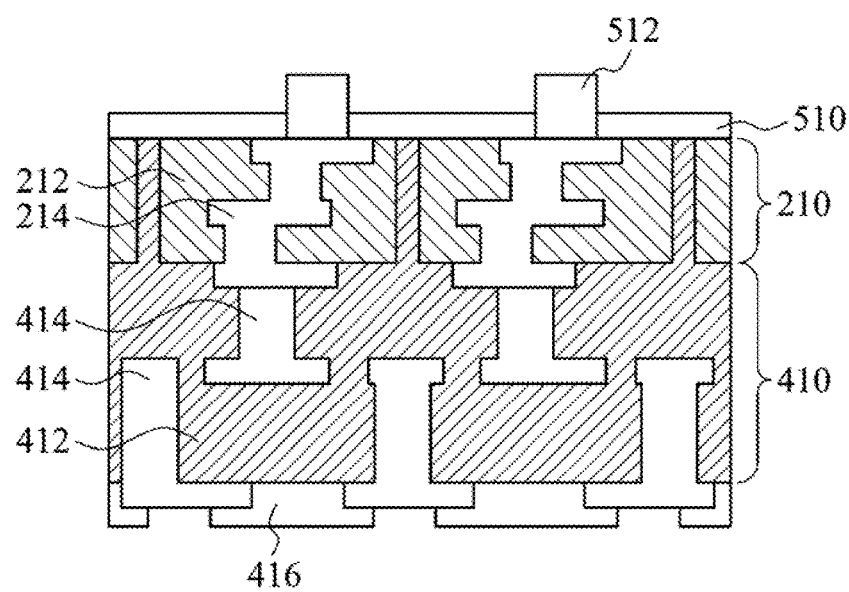

In the embodiment depicted in FIG. 4A, the package device 100 may successively form different patterns as in FIGS. 5A-5C, respectively.

In the embodiment shown in FIG. 5A, the substrate 110 (shown in FIG. 4A) and the release film 112 (shown in FIG. 4A) are removed from the package device 100, and the package device 100 is turned over. As a result, the first side of the redistribution structure 210 is located below.

In the embodiment shown in FIG. 5B, the substrate 110 (shown in FIG. 4A) and the release film 112 (shown in FIG. 4A) of the package device 100 are removed, and the solder mask structure 510 is formed on the redistribution structure 210. Then, the entire package device 100 is turned over, and therefore the first side of the redistribution structure 210 is located below.

In the embodiment shown in FIG. 5C, the substrate 110 (shown in FIG. 4A) and the release film 112 (shown in FIG. 4A) are removed from the package device 100, and the solder mask structure 510 and the conductive posts 512 (e.g., a copper pillar structure) are formed on the redistribution structure 210. Then, the entire package device 100 is turned over, and therefore the first side of the redistribution structure 210 is located below.

It is to be understood that removing the substrate 110 and the release film 112 and forming the solder mask structure 510 and the conductive posts 512 on the redistribution structure 210 may also be performed on the package device 100 depicted in FIG. 4B (not shown).

Figure 6A:
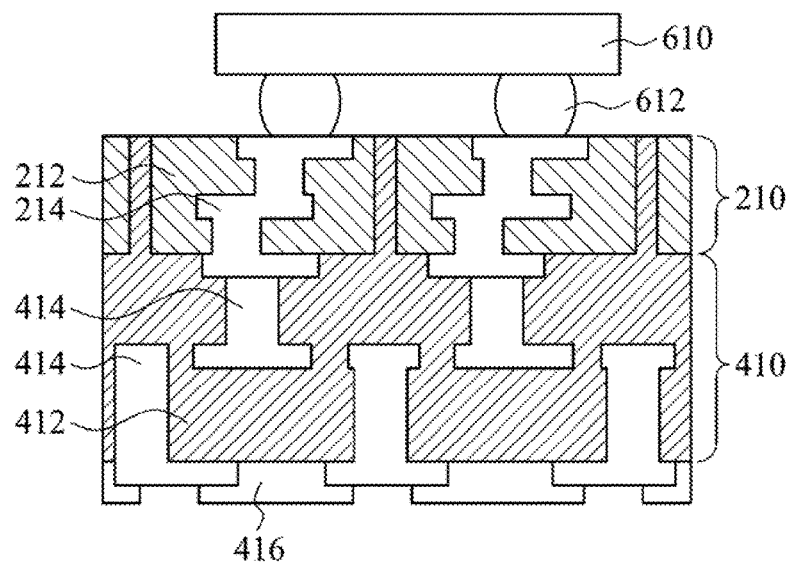
Figure 6B:
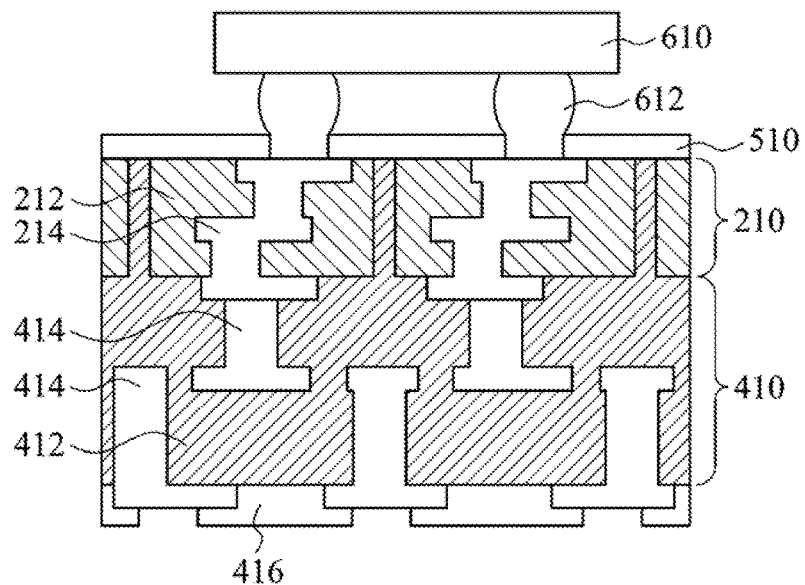
Figure 6C:
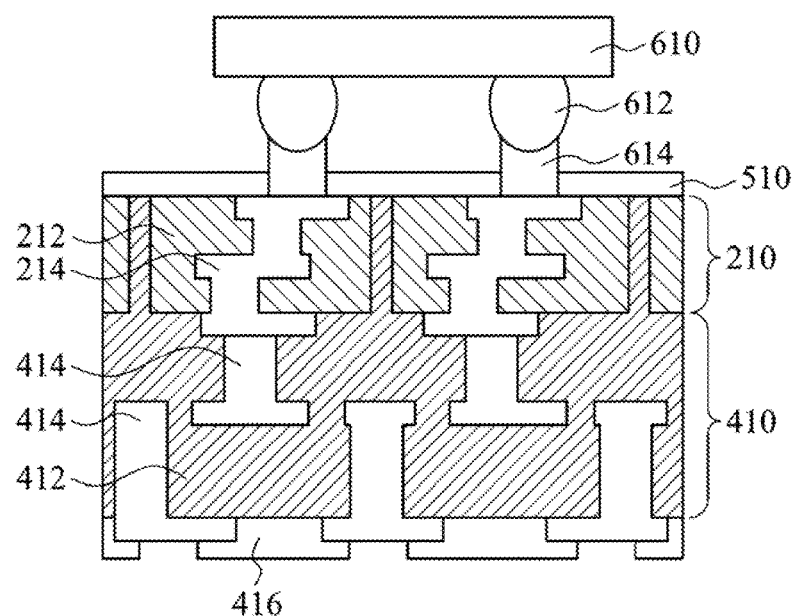

In the embodiment shown in FIGS. 6A-6C, a first electronic component 610 is arranged on the second side, opposite to the first side, of the redistribution structure 210 as shown in FIGS. 5A to 5C, respectively. As illustrated in FIG. 6A, the first electronic component 610 is electrically connected to the second side, opposite to the first side, of the redistribution structure 210 by the first connectors 612. As illustrated in FIG. 6B, the first electronic component 610 is electrically connected to the second side, opposite to the first side, of the redistribution structure 210 having the solder mask structure 510 by the first connectors 612. As illustrated in FIG. 6C, the first electronic component 610 is electrically connected to the conductive posts 614 on the redistribution structure 210 having the solder mask structure 510 and the conductive posts 614 by the first connectors 612. In some embodiments of this disclosure, the first connectors 612 may be solder ball or solder bump made by the material of tin. In some embodiments of this disclosure, the first electronic component 610 may be an active element or a passive element. The active element may be a semiconductor wafer, the passive element may be a resistive element, a capacitive element, an inductive element, or a wafer-type passive element.

FIGS. 7 to 10 illustrate cross-sectional views of different steps of the manufacturing method of the package device 200 according to another embodiment of this disclosure.

Figure 7:
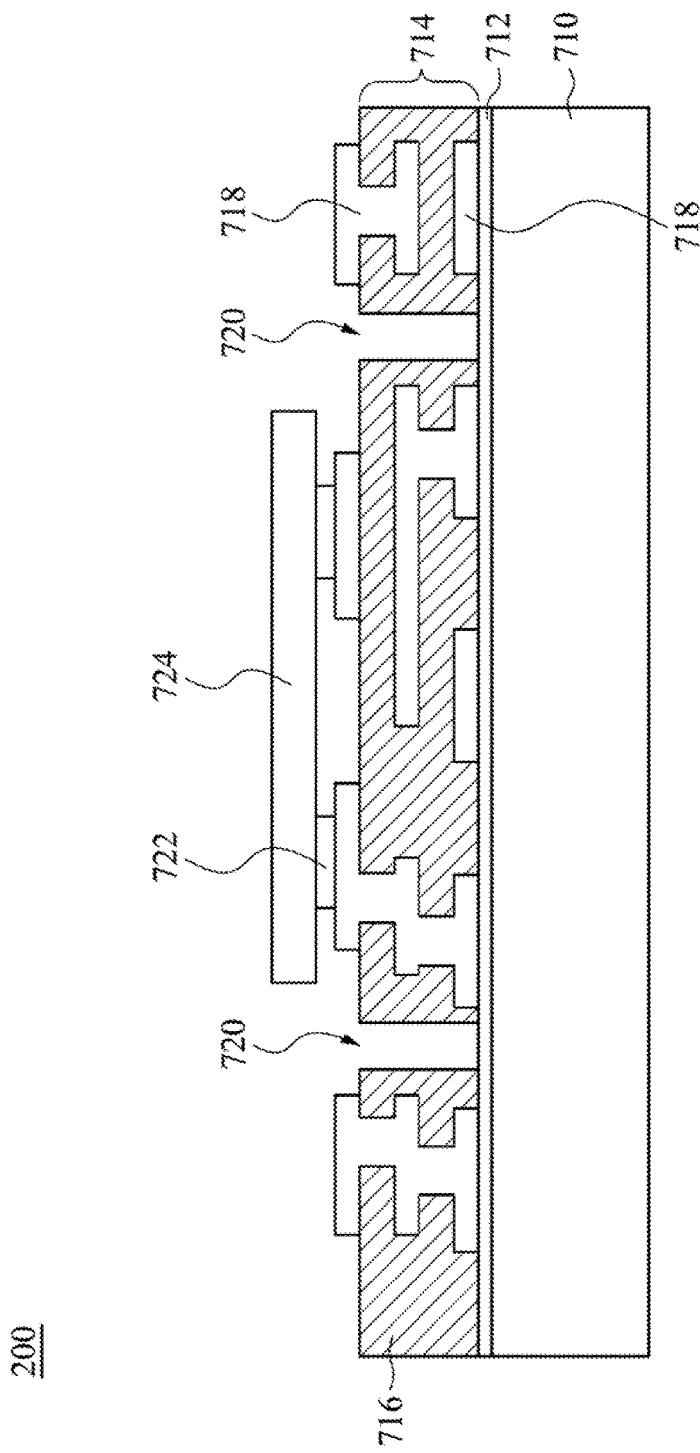
FIG. 7 to FIG. 10 are schematic cross-sectional views illustrating different steps of the manufacturing method of the package device according to another embodiment of this disclosure.

In the embodiment shown in FIG. 7, a substrate 710 is provided, and a release film 712 is provided on the substrate 710. The redistribution structure 714 is located on the substrate 710. The formation of the redistribution structure 714 includes forming a first dielectric layer 716 on the substrate 710, and then removing a portion of the first dielectric layer 716 to form a plurality of first openings. Filling the first metal layer in a plurality of first openings to form a plurality of first metal lines 718. The person having ordinary skill in the art can make proper modifications as necessary to repeat the formation of the redistribution structure 714 to form a plurality of the redistribution structures 714. A plurality of trenches 720 are formed on the first side of the redistribution structure 714. In particular, a portion of the first dielectric layer 716, where there is no metal lines in the redistribution structure, is removed to form a plurality of trenches 720. It is to be noted that the plurality of trenches 720 may penetrate the first dielectric layer 716 to expose the release film 712 (as illustrated in FIG. 7). The plurality of trenches 720 may not penetrate the first dielectric layer 716 (not shown). In some embodiments, the sidewalls of the trench 720 may be curved or flat. In some embodiments, the width of the trench 720 may be from 30 µm to 300 µm, such as 50 µm, 100 µm, 200 µm or 250 µm. In some embodiments, the depth of the trenches may be adjusted as desired. The trenches are formed by a dry etching process, a wet etching process, an exposure developing process or a laser process.

Referring to the embodiment shown in FIG. 7, a plurality of first connectors 722 are formed on the redistribution structure 714, and the first electronic component 724 is disposed on the first connectors 722. Therefore, the first electronic component 724 is electrically connected to the redistribution structure 714 by the first connectors 722. In some embodiments of this disclosure, the first connectors 722 may be solder ball or solder bump made by the material of tin. In some embodiments of this disclosure, the first electronic component 724 may be an active element or a passive element, wherein the active element may be a semiconductor wafer, the passive element may be a resistive element, a capacitive element, an inductive element, or a wafer type passive element.

In the package device 200 illustrated in FIG. 7, the substrate 710 may be a glass substrate, a metal substrate or an organic material substrate. The material of the release film 712 may be polyethylene terephthalate (PET). It is to be understood that the material of the substrate 710 and the release film 712 described above is merely illustrative and is not intended to limit this disclosure. The person having ordinary skill in the art can make proper modifications to the substrate 710 and the release film 712 depending on actual applications. In some embodiments of this disclosure, the material of the first metal lines 718 comprises aluminum, copper, tungsten, or a combination thereof, but not so, other suitable conductive materials may likewise be used to form the first metal wire 718. In some embodiments of this disclosure, the first dielectric layer 716 is comprised of a material capable of forming high density fine lines. In some embodiments, the material of the first dielectric layer 716 is a photoimageable dielectric material, such as polybenzoxazole (PBO). It is to be understood that the material of the first dielectric layer 716 described above is by way of example only and is not intended to limit the invention, and that the person having ordinary skill in the art can make proper modifications to the first dielectric layer 716 depending on actual applications.

Figure 8:
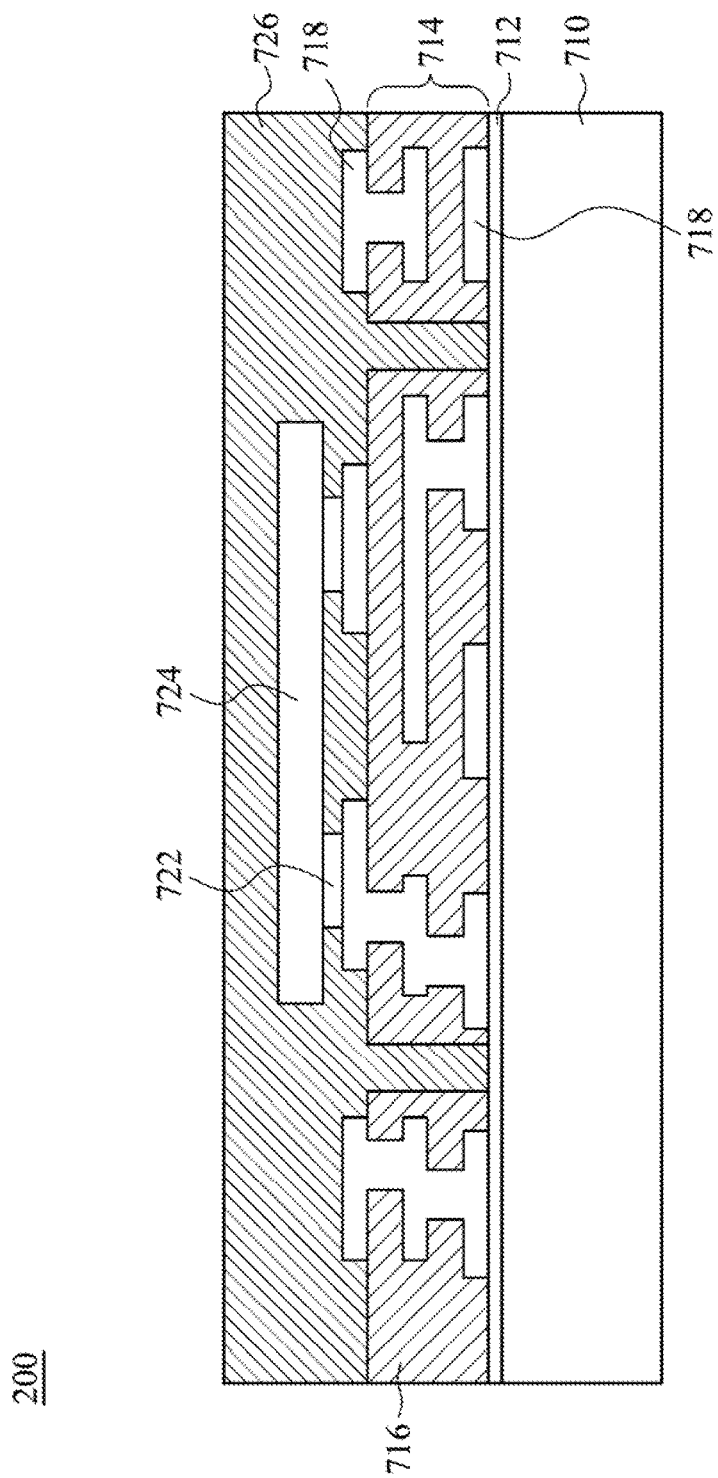

In the embodiment depicted in FIG. 8, the molding layer 726 is covered on the redistribution structure 714 and the first electronic component 724 and the molding layer 726 is filled in a plurality of trenches 720. Therefore, the molding layer 726 has a plurality of protrusions embedded in the redistribution structure 714. The material of the molding layer may be an epoxy resin. The above-mentioned molding materials are merely illustrative and are not intended to limit this disclosure. The person having ordinary skill in the art can choose proper material of the molding layer 726 depending on actual applications. In some embodiments of this disclosure, the thermal expansion coefficient of the mold sealing layer 726 is less than the thermal expansion coefficient of the first dielectric layer 716. In some embodiments of this disclosure, the Young's modulus of the molding layer 726 is higher than the Young's modulus of the first dielectric layer 716.

Figure 9:
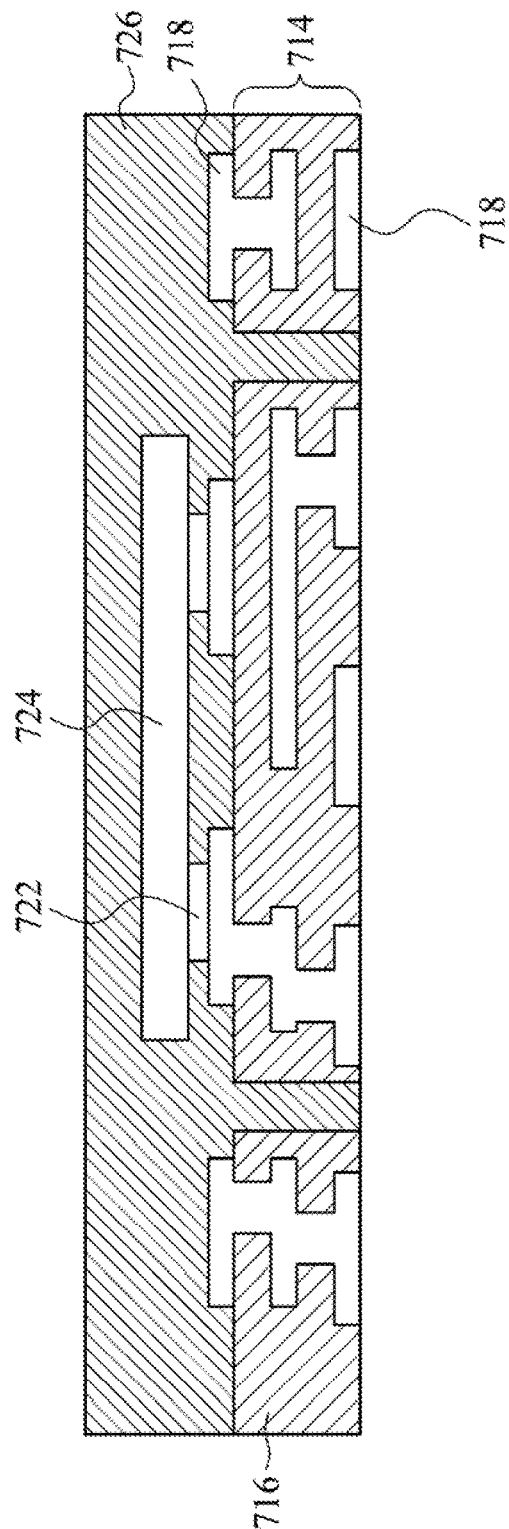

In the embodiment shown in FIG. 9, the substrate 710 and the release film 712 are removed.

Figure 10:
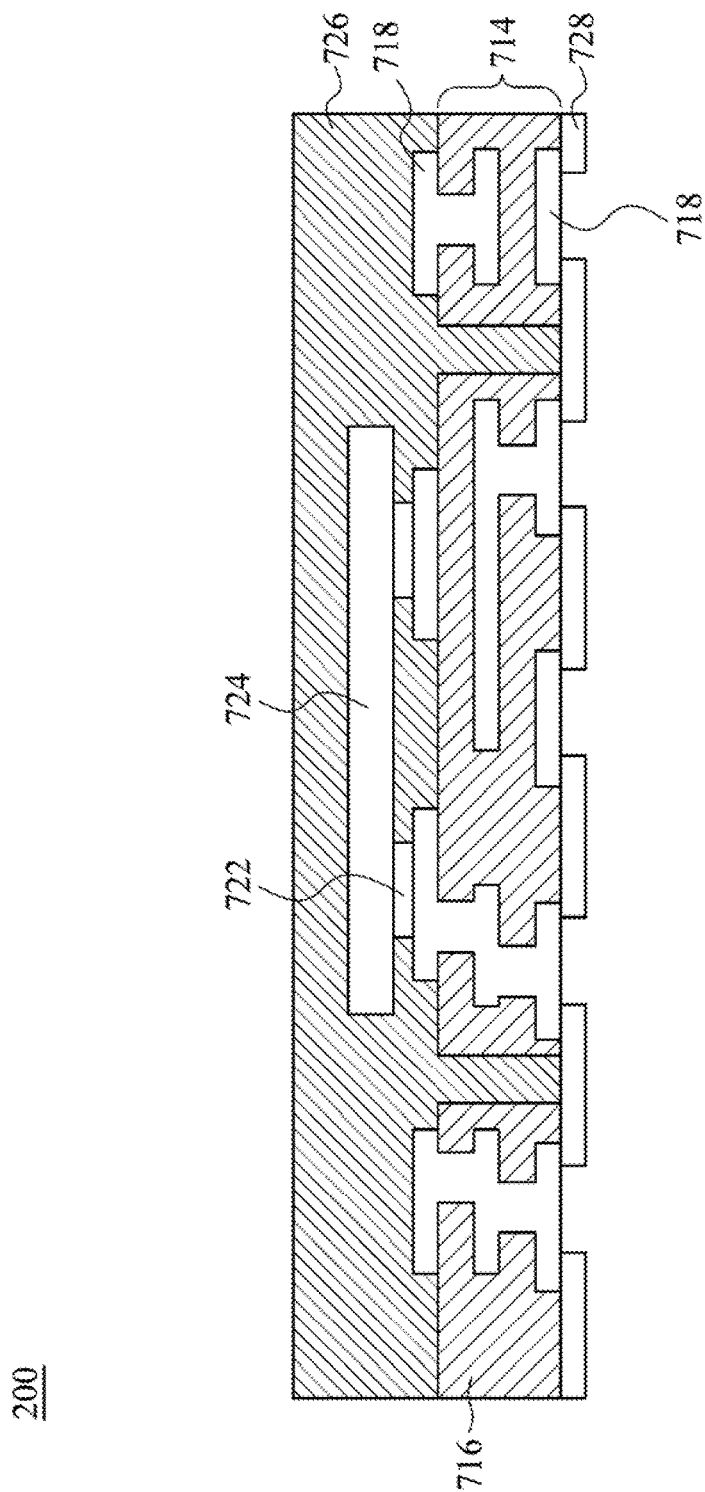

As in the embodiment depicted in FIG. 10, the solder mask structure 728 may be selectively formed on one side of the redistribution structure 714.

FIGS. 11 to 15 illustrate cross-sectional views of different steps of the manufacturing method of the package device 300 according to an embodiment of this disclosure.

Figure 11:
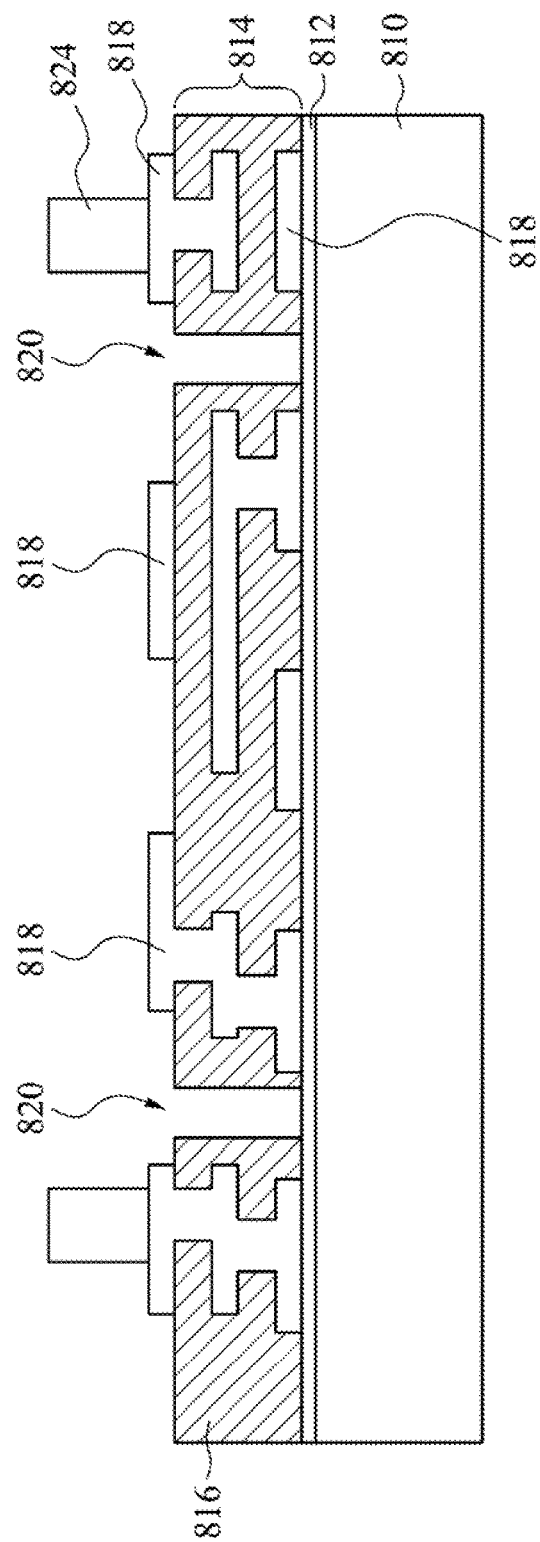
FIG. 11 to FIG. 15 are schematic cross-sectional views illustrating different steps of the manufacturing method of the package device according to another embodiment of this disclosure.

In the embodiment shown in FIG. 11, the substrate 810 having a release film 812 is provided. A redistribution structure 814 is disposed on the substrate 810. The redistribution structure 814 is formed by forming a first dielectric layer 816 on the substrate 810, and then removing a portion of the first dielectric layer 816 to form a plurality of first openings. The first metal layer is filled in a plurality of first openings to form a plurality of first metal lines 818. The person having ordinary skill in the art can make proper modifications as necessary to repeat the formation of the redistribution structure 814 to form a plurality of redistribution structures 814. Next, the trenches 820 are formed in the first side of the redistribution structure 814. In particular, a partial of the first dielectric layer 816, where there is no metal lines in the redistribution structure, is removed to form a plurality of trenches 820. It is to be noted that the plurality of trenches 820 may penetrate the first dielectric layer 816 to expose the release film 812 (as illustrated in FIG. 11). The plurality of trenches 820 may not penetrate the first dielectric layer 816 (not shown). In some embodiments, the sidewalls of the trenches 820 may be curved or flat. In some embodiments, the width of the trenches 820 may be from 30 µm to 300 µm, such as 50 µm, 100 µm, 200 µm or 250 µm. In some embodiments, the depth of the trenches may be adjusted as desired. The trenches are formed by a dry etching process, a wet etching process, an exposure developing process or a laser process.

Referring to the embodiment of FIG. 11, a plurality of conductive posts 824 are formed on the first metal lines 818 to electrically connect the conductive posts 824 to the first metal lines 818. In some embodiments of this disclosure, the material of the first metal lines 818 and the conductive posts 824 comprises aluminum, copper, tungsten, or a combination thereof, but not so, other suitable conductive materials may likewise be used to form the first metal lines 818. In some embodiments of this disclosure, the first dielectric layer 816 is comprised of a material capable of forming high density fine lines. In some embodiments, the material of the first dielectric layer 816 is a photoimageable dielectric material, such as polybenzoxazole (PBO). It is to be understood that the material of the first dielectric layer 816 described above is merely illustrative and is not intended to limit the invention. The person having ordinary skill in the art can choose proper material of the first dielectric layer 816 depending on actual applications.

Figure 12:
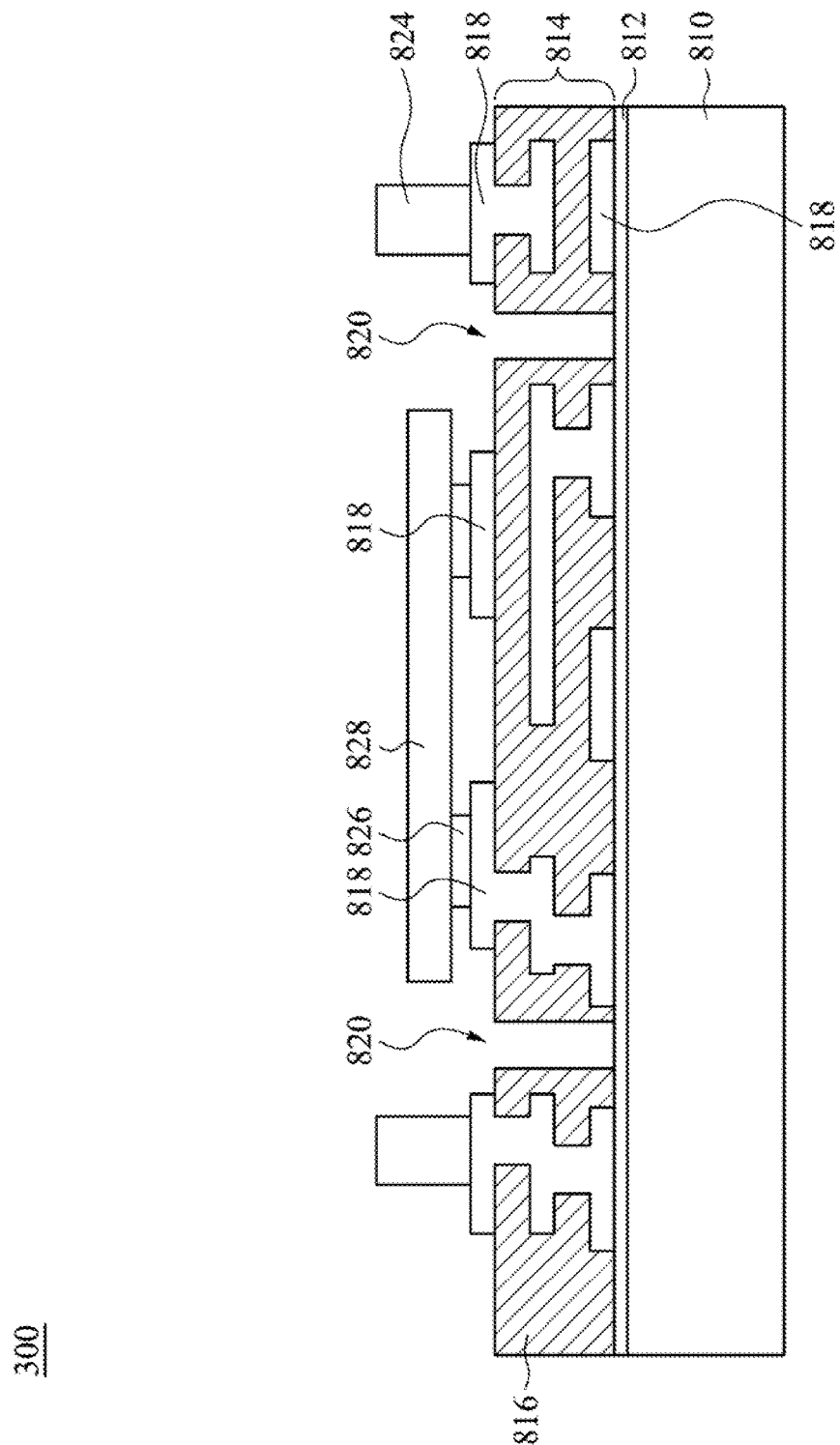

In the embodiment depicted in FIG. 12, a plurality of first connectors 826 are formed on the redistribution structure 814 and a first electronic component 828 is disposed on the plurality of first connectors 826. Therefore, the first electronic component 828 is electrically connected to the redistribution structure 814. It is to be noted that the plurality of conductive posts 824 are higher than the first electronic component 828. In some embodiments of this disclosure, the first connectors 826 may be solder ball or solder bump of made by the material of tin. In some embodiments of this disclosure, the first electronic component 828 may be an active element or a passive element, wherein the active element may be a semiconductor wafer, the passive element may be a resistive element, a capacitive element, an inductive element, or a wafer type passive element.

Figure 13:
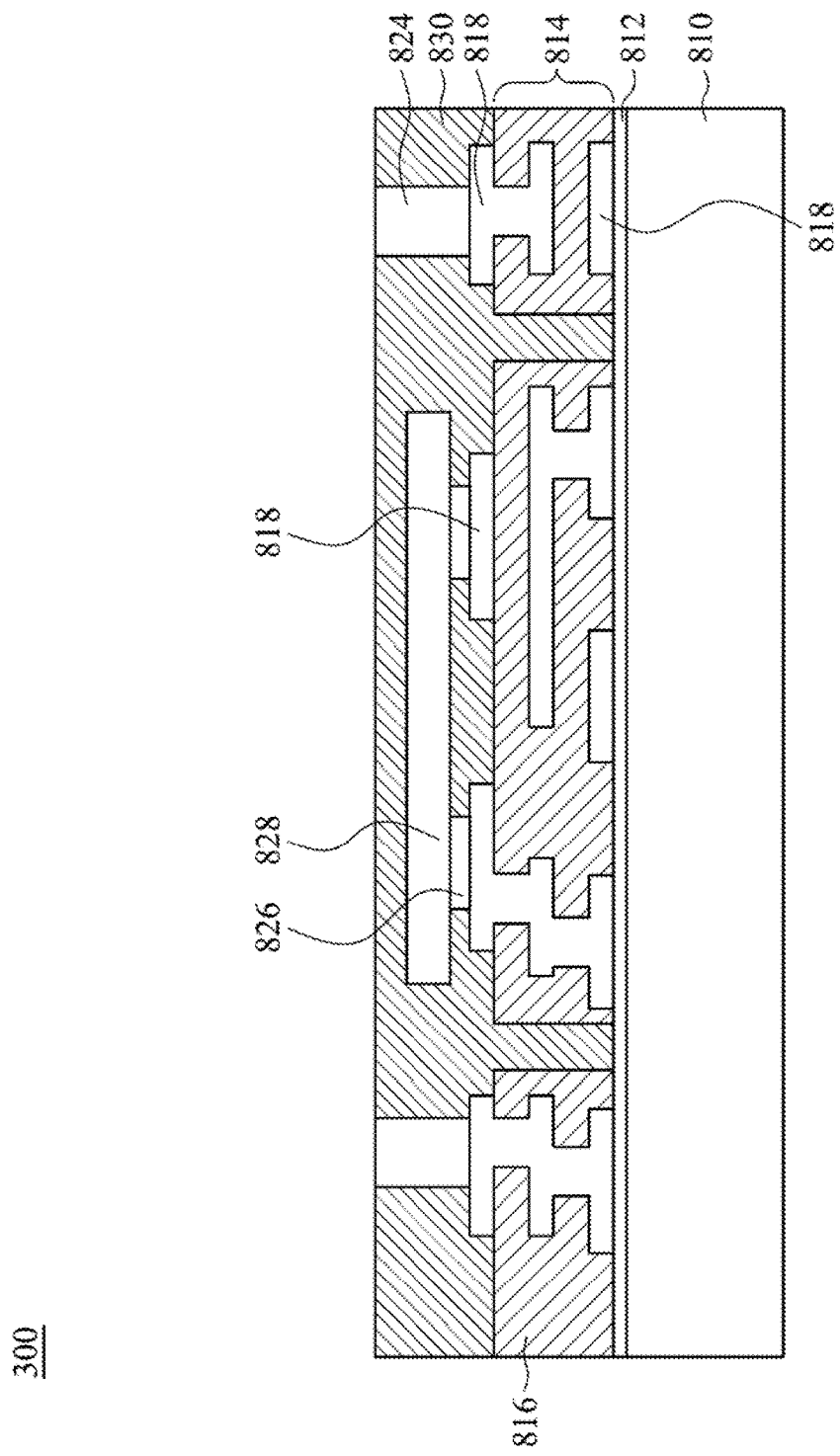

In the embodiment depicted in FIG. 13, the molding layer 830 covering on the redistribution structure 814, the plurality of conductive posts 824 and the first electronic component 828. The molding layer 830 is filled within the trenches 820 in the redistribution structure 814. Therefore, the molding layer 830 has a plurality of protrusions embedded in the redistribution structure 814. The molding layer 830 is etched and thinned to expose the plurality of conductive posts 824. The material of the molding layer 830 may be an epoxy resin. The above-mentioned molding layer 830 materials are merely illustrative and are not intended to limit this disclosure. The person having ordinary skill in the art can choose proper material of the molding layer 830 depending on actual applications In some embodiments of this disclosure, the thermal expansion coefficient of the molding layer 830 is less than the thermal expansion coefficient of the first dielectric layer 816. In some embodiments of this disclosure, the Young's modulus of the mold seal layer 830 is higher than the Young's modulus of the first dielectric layer 816.

Figure 14:
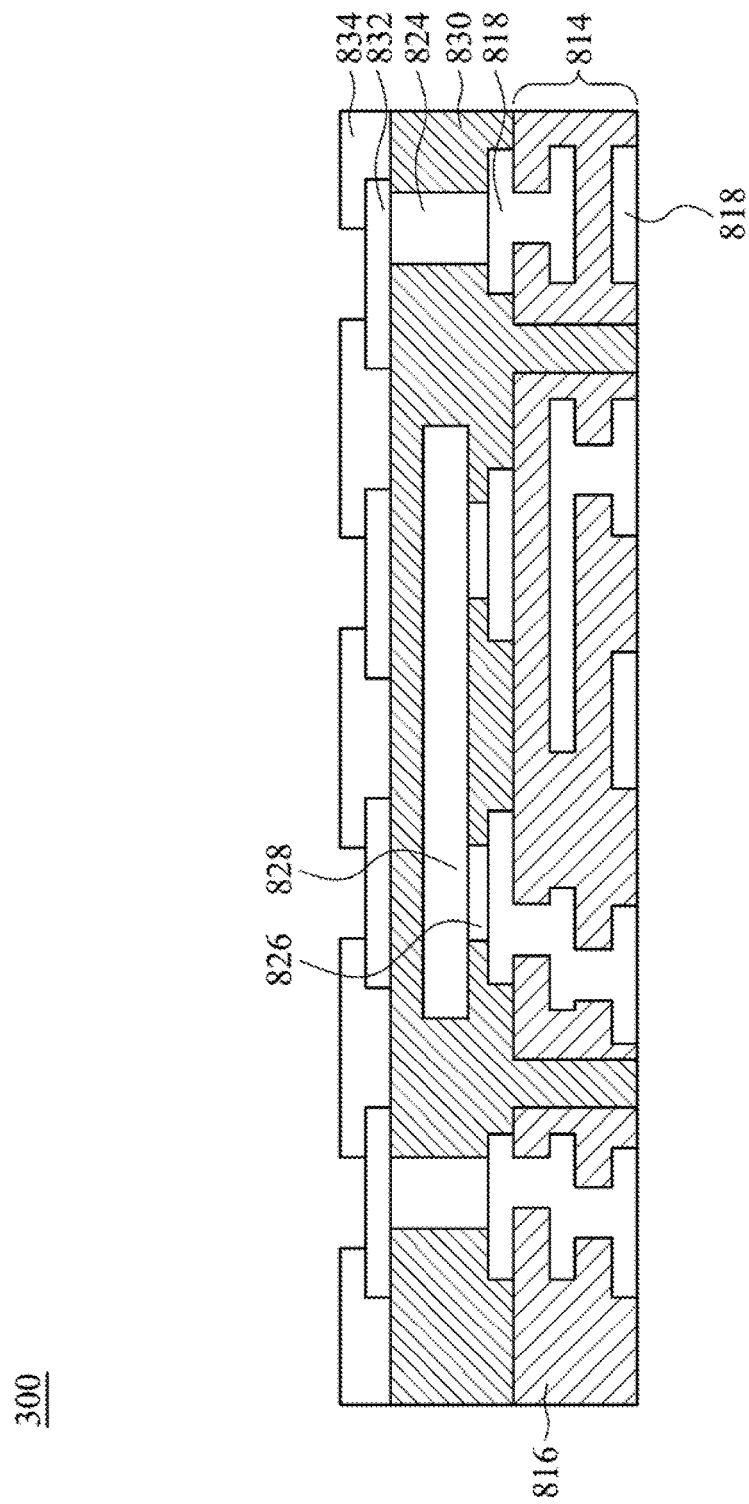

In the embodiment depicted in FIG. 14, a metal layer 832 is formed on the molding layer 830. Therefore, the metal layer 832 is electrically connected to the conductive posts 824. Then, a solder mask structure 834 is formed on the metal layer 832. Next, the substrate 810 and the release film 812 are removed.

Figure 15:
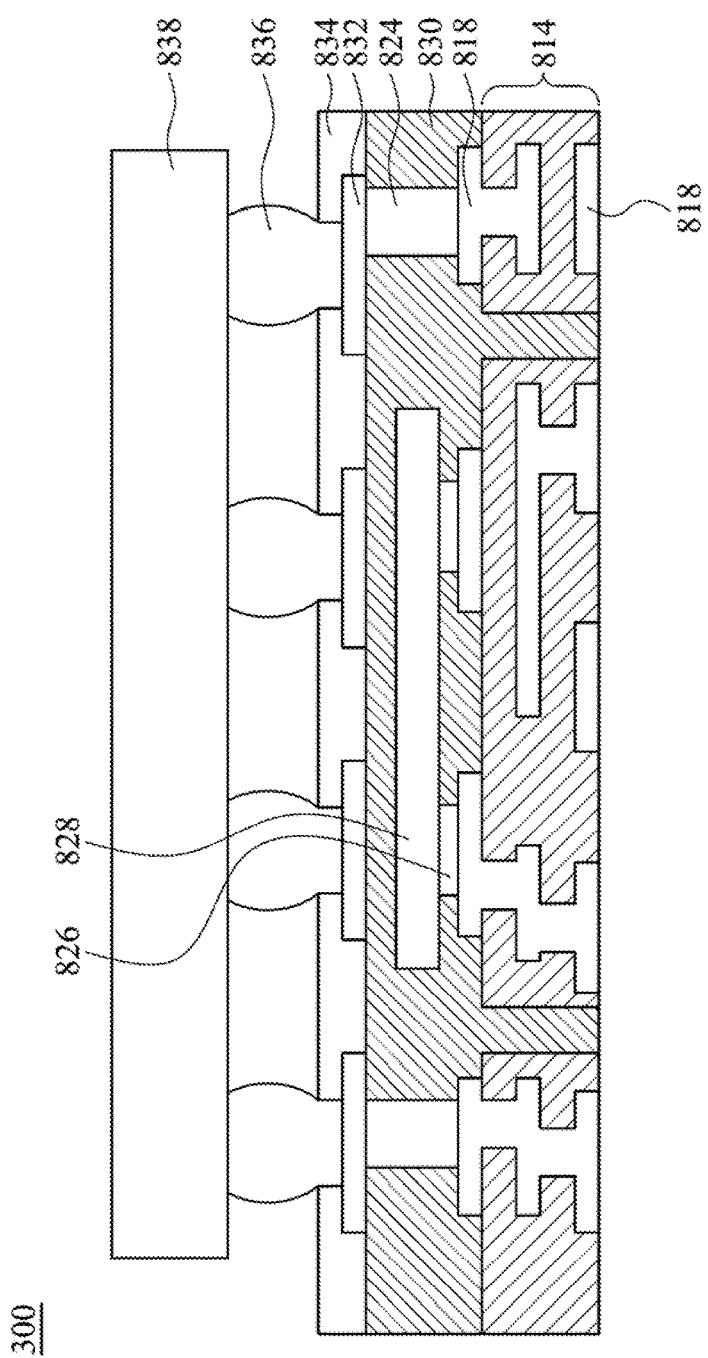

In the embodiment depicted in FIG. 15, a plurality of second connectors 836 are formed on the metal layer 832 and the second connectors 836 are electrically connected to the conductive posts 824. Next, the second electronic component 838 is disposed on the second connectors 836 to form a package on package. In some embodiments of this disclosure, the second connectors 836 may be solder ball or solder bump made by the material of tin, but is not limited thereto. In some embodiments of this disclosure, the second electronic component 838 may be an active element or a passive element, wherein the active element may be a semiconductor wafer, the passive element may be a resistive element, a capacitive element, an inductive element, or a wafer type passive element. In some embodiments of this disclosure, the second electronic component 838 may be a package device.

Most of the materials that capable of forming high density fine lines have low elasticity coefficient, high thermal expansion rate, and lower tensile strength. Therefore, when it is integrated with the other materials, the internal stress will rise, owing to the thermal stress, and result in the risk of structural cracking. Therefore, to avoid the internal stress, it is needed to consider the difference of the relative elasticity coefficient and the difference of the relative thermal expansion coefficient when different materials are integrated in build-up process or package process. The above-described embodiments of this disclosure are achieved by forming a plurality of trenches 310, 312, 720, 820 in the first dielectric layer 212, which is comprised of a material capable of forming high density fine lines, of a redistribution structure, then by filling the second dielectric layer of a circuit board structure or the molding material within the trenches. In the first dielectric layer 212 of the redistribution structure, a region without metal lines may form a trench as desired, and the trench may not penetrate the first redistribution layer or may penetrate the first redistribution layer. In some embodiments of this disclosure, the thermal expansion coefficient of the second dielectric layer or the molding layer is less than the thermal expansion coefficient of the first dielectric layer. In some embodiments of this disclosure, the Young's modulus of the second dielectric or the molding layer is higher than the Young's modulus of the material of the first dielectric layer. This manufacturing method avoids warping or twisting of the structure of the first redistribution layer, thereby improving the structural stability, flatness and contact yield.

Although this disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of this disclosure without departing from the scope or spirit of the invention. In view of the foregoing, it is intended that this disclosure cover modifications and variations of this invention provided they fall within the scope of the following claims.

What is claimed is:

1. A method of manufacturing a package device, comprising:
    forming at least one redistribution structure on a substrate, comprising:
        forming a first dielectric layer on the substrate;
        removing a portion of the first dielectric layer to form a plurality of first openings; and
        filling a first metal layer in the first openings;
    forming a plurality of trenches in a first side of the redistribution structure;
    forming a circuit board structure on the first side of the redistribution structure, and the redistribution structure is electrically connected to the circuit board structure, wherein forming the circuit board structure comprising:
        forming a second dielectric layer on the first side of the redistribution structure and filling the second dielectric layer in the trenches;
        removing a portion of the second dielectric layer to form a plurality of second openings;
        filling a second metal layer in the second openings; and
    removing the substrate.

2. The manufacturing method of claim 1, further comprising disposing a first electronic component on a second side, opposite to the first side, of the redistribution structure, wherein the first electronic component electrically connected to the redistribution structure.

3. The manufacturing method of claim 1, wherein the trenches are formed penetrating the redistribution structure.

4. A method for manufacturing a package device, comprising:
    forming at least one redistribution structure on a substrate, comprising:
        forming a first dielectric layer on the substrate;
        removing a portion of the first dielectric layer to form a plurality of first openings; and
        filling a first metal layer in the first openings;
    removing a portion of the first dielectric layer to form a plurality of trenches in a first side of the redistribution structure;
    disposing a first electronic component on the first side of the redistribution structure, wherein the first electronic component is electrically connected to the redistribution structure;
    forming a molding layer covering the redistribution structure and the first electronic component, and filling the molding layer in the trenches; and
    removing the substrate.

5. The manufacturing method of claim 4, wherein the trenches are formed penetrating through the redistribution structure.

6. The manufacturing method of claim 4 further comprising:
    forming a plurality of conductive posts on the first side of the redistribution structure before forming the molding layer, and electrically connecting the conductive posts to the redistribution structure;

thinning the molding layer to expose the conductive posts;

forming a plurality of second connectors on the molding layer, and electrically connecting the second connectors to the conductive posts; and deposing a second electronic component on the second connectors to form a package on package structure.

7. A package device comprising:
at least one redistribution structure, comprising:
   a first dielectric layer; and
   a plurality of first metal lines disposed in the first dielectric layer;
a circuit board structure disposed on a first side of the redistribution structure, the circuit board structure comprising:
   a second dielectric layer, wherein the second dielectric layer has a plurality of protrusions embedded in the redistribution structure; and
   a plurality of second metal lines located in the second dielectric layer and electrically connected to the redistribution structure;
a first electronic component disposed on a second side, opposite to the first side, of the redistribution structure; and
a plurality of first connectors disposed between the redistribution structure and the first electronic component, and the first connectors electrically connect the redistribution structure and the first electronic component.

8. The package device of claim 7, wherein the protrusions of the second dielectric layer are formed penetrating the redistribution structure.

9. The package device of claim 7, wherein a Young's modulus of the second dielectric layer is larger than a Young's modulus of the first dielectric layer.

10. The package device of claim 7, wherein a thermal expansion coefficient of the second dielectric layer is smaller than a thermal expansion coefficient of the first dielectric layer.

11. A package device comprising:
at least one redistribution structure, comprising:
   a first dielectric layer; and
   a plurality of first metal lines located in the first dielectric layer;
a first electronic component disposed on the redistribution structure;
a plurality of first connectors disposed between the redistribution structure and the first electronic component, and the first connectors electrically connect the redistribution structure and the first electronic component; and
a molding layer covering the redistribution structure and the first electronic component, and the molding layer having a plurality of protrusions embedded in the redistribution structure.

12. The package device of claim 11, wherein a Young's modulus of the molding layer is larger than a Young's modulus of the first dielectric layer.

* * * * *